United States Patent
Duh et al.

(10) Patent No.: US 7,169,627 B2
(45) Date of Patent: Jan. 30, 2007

(54) METHOD FOR INSPECTING A CONNECTING SURFACE OF A FLIP CHIP

(75) Inventors: Jenq-Gong Duh, Hsinchu (TW); Shui-Jin Lu, Hsinchu Hsien (TW)

(73) Assignee: National Tsing Hua University, Hsinchu (TW)

(*) Notice: Subject to any disclaimer, the term of this patent is extended or adjusted under 35 U.S.C. 154(b) by 263 days.

(21) Appl. No.: 10/840,287

(22) Filed: May 7, 2004

(65) Prior Publication Data
US 2004/0253749 A1   Dec. 16, 2004

(30) Foreign Application Priority Data
Jun. 5, 2003 (TW) ............... 92115166 A

(51) Int. Cl.
*H01L 21/66* (2006.01)
(52) U.S. Cl. ............... 438/16; 438/14; 438/15; 438/800; 356/36; 356/237.1; 356/237.2; 257/E23.001
(58) Field of Classification Search ............... 438/14, 438/15, 16, 800; 356/36, 237.1, 237.2
See application file for complete search history.

(56) References Cited

U.S. PATENT DOCUMENTS 6,013,572 A * 1/2000 Hur et al. ............... 438/614
6,576,900 B2 * 6/2003 Kelly et al. ............... 250/307
6,657,707 B1 * 12/2003 Morken et al. ............... 356/36

FOREIGN PATENT DOCUMENTS

TW   329020 A   4/1998

* cited by examiner

*Primary Examiner*—Zandra V. Smith
*Assistant Examiner*—Christy Novacek
(74) *Attorney, Agent, or Firm*—Birch, Stewart, Kolasch & Birch, LLP

(57) ABSTRACT

The present invention provides a method for inspecting a connecting surface of a flip chip to solve problems that the grinding, polishing and chemical etching method is used for making a sample. The present invention utilizes ion beam etching technology for making and processing a sample of the flip chip (FC). The ion beam etching technology includes two modes: keeping the energy of ion beam and increasing the etching time; and keeping the etching time and increasing the ion beam energy. The ion beam etching technology can remove a deforming portion between the solder ball and the metal pad, which is connected thereto because of the grinding and polishing. Specially, it is easy to analyse a sample of a scanning electron microscope (SEM) which includes an intermetallic compound formed between the solder ball and the metal pad connected thereto.

5 Claims, 12 Drawing Sheets

METHOD FOR INSPECTING A CONNECTING SURFACE OF A FLIP CHIP

This Non-provisional application claims priority under 35 U.S.C. § 119(a) on patent application No(s). 092115166 filed in Taiwan on Jun. 5, 2003, the entire contents of which are hereby incorporated by reference.

FIELD OF THE INVENTION

The present invention relates to a method for inspecting a connecting surface of a flip chip, and more particularly to a method for making a sample of a flip chip.

BACKGROUND OF THE INVENTION

Conventional package processes of the integrated circuit (IC) is used for one set of one and includes the following steps: providing a lead frame or a substrate; attaching a die (chip); providing a plurality of bonding wires; molding the die; and trimming and forming a package. The size of the packaged integral circuit is several times bigger than that of the chip. The flip chip is provided with a bump which is made of Cu or solder for soldering the chip to a printed circuit board (PCB). When the flip chip is mounted on the PCB, the active surface of a flip chip faces down (hence the name).

A connection of the flip chip is also known as a controlled collapse chip connection (C4 connection) and developed by the IBM Corporation of U.S.A. The flip chip connection belongs to a connection technology of the area array, and does not belong to connection technologies of a wire bond and a tape automated bonding (TAB) that only provides a connection of the peripheral array. Thus, the flip chip connection can be applied to a process and packaged with much higher wire density. The proportion of the connection technology of the flip chip to the future connection technology of the package with higher wire density will be large.

The principle of flip chip connections is that solder bumps are firstly formed on the metal pad of a chip, the chip is put on a substrate, the solder bumps the chip are aligned with pads of the substrate, and the chip and substrate are processed by means of heat treatment of reflow. After the solder melted, it forms a ball by means of surface tension, such that the connection between the chip and the substrate is complete.

There are many types of solder. Typical solders are as follows: an alloy (95% Pb and 5% Sn) with high melting point, an alloy (51% indium, 32.5% bismuth and 16.5% Sn) with low melting point, an alloy (63% Pb and 37% Sn) with low melting point and an alloy (50% Pb and 50% indium) with low melting point. During solder bump manufacture, a chip is coated with a passivation layer for sealing and keeps the solder dry. After a hole is formed and disposed above a metal pad, a multi-layer metal thin film (general called as under bump metallurgy) with Cr, Cu and Au is sputtered for providing adhesion and diffusive obstruction, increasing the wetness of solder and avoiding oxidation. Then, an alloy (Pb and Sn) with 100~125 µm is formed by means of technology of evaporation, dipping or ultrasonic soldering. During subsequent processes of heat treatment of connection, the solder layer will form a ball-shaped solder bump by means of surface tension after the solder melts. Conversely, a pad of a substrate must also be plated with a multi-layers metal thin layer (called as top surface metallurgy, TSM) for providing the wetting of connection of the solder bump.

The reliability of soldering a connection between different materials is an important consideration of the reliability of an electronic product. Among solder material, upper and lower main material to be soldered, atoms is moved to induce the reaction between interfaces and further an intermetallic compound (IMC) is formed because of different chemical formulas. The intermetallic compound which is generated is the main factor of crack and damage the soldering connection. All the thickness, kind, shape and composition of the intermetallic compound are formed by using the heat treatment greatly affect the electrical performance and reliability of the flip chip. Thus, it is very important for analysis work to make a clear photo using scanning electron microscopy (SEM) for understanding the reaction between interfaces of the intermetallic compound.

In addition, the stress which is generated by the difference between the coefficient of thermal expansion of the chip and the substrate, and the fatigue which is generated by the repeated operating temperature are also the main factors of damage of the soldering connection of the solder bump of the flip chip. The fatigue damage of the soldering connection includes a mechanical fatigue and a thermal fatigue, and the latter is a major factor.

The chemical composition, mechanical property, height, shape and geometric arrangement of the solder are also important factors of soldered connection lifetimes except the difference between the coefficient of thermal expansion and repeating operating temperature. Thus, resisting the fatigue of the soldering connection has been an important research subject for improving the reliability of the connection of the flip chip.

In a conventional material analysis technology, a scanning electron microscopy should be the most used. The scanning electron microscopy includes an electron gun that emits an electron beam downwards. The electron beam is focused through a set of condenser lens, passes through a set of scanning coil of controlling electron beam by using a condenser aperture to select the beam size, and then is focused on a sample through an objective lens. A signal receiver device is disposed above the sample for selecting secondary electrons or backscattered electrons to form an image.

According to the sample which is used in the scanning electron microscopy, conventional processing method removes a deforming layer of the sample by utilizing a chemical etching method. The chemical etching is a selective etching method, and therefore different chemical solutions which are used to etch the deforming layer depend on different kinds of materials and the composition to be researched. In other words, a specific chemical solution only etches a specific material or composition. Thus, the sample includes various elements or phases that can have a problem of over-etching of some element or phase by utilizing the chemical etching. Careful consideration is required to the dangers of making the chemical solution and the effects of polluting the environment.

Taiwan Patent No. 329,020 entitled "Making Technology Of Sample of An Electron Microscopy Of A Thin Film Transistor", discloses that a sample of an electron microscope is made by utilizing grinding and polishing technology. However, after cutting, grinding and polishing, a deforming layer can be formed on a typical sample that affects the inspection of the SEM photo.

Accordingly, there exists a need for a method of inspecting a connecting surface of a flip chip to solve the above-mentioned problems and disadvantages.

SUMMARY OF THE INVENTION

It is an object of the present invention to provide a method for inspecting a connecting surface of a flip chip.

It is another object of the present invention to solve problems of a chemical etching method for making a sample of a scanning electron microscopy.

In order to achieve the foregoing objects, the present invention provides a method for inspecting a connecting surface of a flip chip for making and processing a sample according to a connection structure of a flip chip (FC). The method includes the following steps: cutting the connecting structure of the flip chip, then forming a thin flip chip after grinding and polishing; and processing a surface of the thin flip chip so as to get the necessary sample of a scanning electron microscope (SEM) by an ion beam etching method.

The present invention discloses a method that utilizes the ion beam etching method for processing a surface of the sample of the flip chip. The ion beam etching method mainly controls two conditions: the energy of the ion beam and etching time for processing the surface of the sample. The follow advantages are:

(1). the ion beam etching method does not belong to the selective etching method and suitably applies to a sample with multi-material or multi-phase;

(2). the energy of an ion beam, the magnitude of current and the type of reactive gas can be adjusted and therefore the ion beam etching method is suitably applied to precise etching with a low etching rate so as to decrease damage to the sample;

(3). the control of process parameters is precise and convenient and the reappearance of condition of the sample is also high; and (4). the ion beam etching method can be applied to the etching of small area for etching a specific area of the sample.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
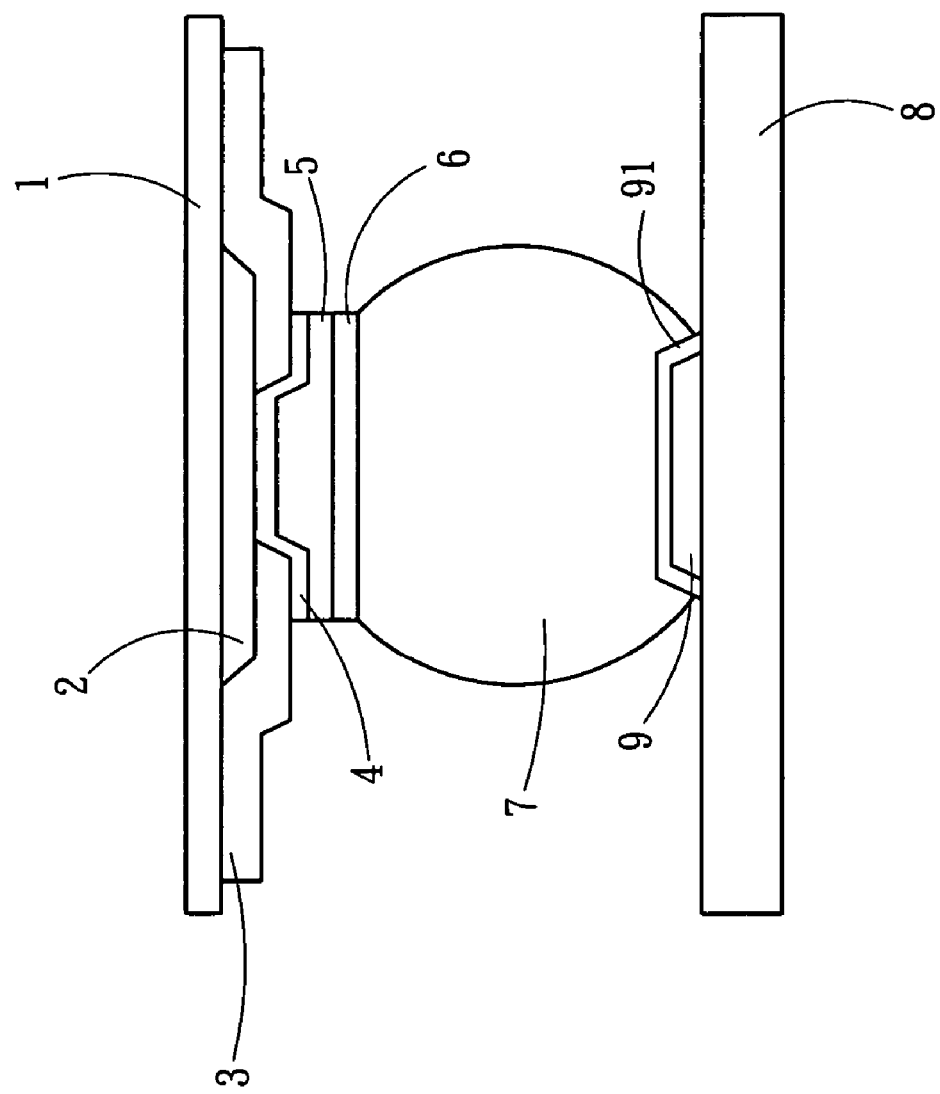
FIG. 1 is a connecting structural view of a single solder ball and a metal pad connected thereto according to a flip chip technology.

Referring to FIG. 1, a single solder bump, the connecting structure of a metal pad and a solder pad to be connected with the flip chip connection technology is described in an example hereafter. As shown in FIG. 1, a dielectric passivation layer 3 with a nitride layer is disposed on a surface of a metal pad 2 (e.g. copper pad) of a typical silicon chip 1. A contact hole is formed and connected to the metal pad 2. A multi-layer metal thin film (known as top surface metallurgy, TSM) is formed in the contact hole for wetting the solder bump connection. A method for making the multi-layer metal thin film includes the following steps: forming metal layers Ti 4 and Cu 5 in sequence by utilizing a physical vapor depositing method; forming a Ni layer 6; forming a solder ball 7; and completing a so-called solder bump. A solder pad 9 corresponding to the above-mentioned solder bump and providing a wet connection is formed, a surface of substrate (PCB chip) 8. Another Ni layer 91 is located on a surface of the solder pad 9. The flip chip connection method includes the following steps: aligning the solder bump of the flipped chip 1 with the solder pad 9 of the substrate 8; and then forming the connection by means of the reflow method.

The reliability of soldering connections between different materials is an important consideration of the reliability of an electronic product. Among solder material, upper and lower main material to be soldered, atoms are moved to induce a reaction between the interfaces and further an intermetallic compound (IMC) is formed because of the different chemical formulas. The generated intermetallic compound is the main factor of crack and damage for soldered connections. The thickness, type, shape and composition of the intermetallic compound are formed by using heat treatment greatly affecting the electrical performance and reliability of the flip chip. Thus, it is very important for analysis work to make a clear photo of scanning electron microscopy (SEM) to understand the reaction between interfaces of the intermetallic compound.

The present invention basic includes two following steps:

(1). cutting a connecting structure of the flip chip shown in FIG. 1, then forming a thin flip chip having a thickness being between 2.5 and 3 mm after grinding and polishing;

(2). processing a surface of the above-mention grinded polished thin flip chip so as to get a necessary sample of a scanning electron microscope (SEM) by an ion beam etching method.

The present invention utilizes the ion beam etching method that mainly controls two conditions: energy of ion beam and etching time for processing the surface of the sample and then removing a deforming portion between the solder ball and the metal pad that is connected thereto because of the grinding and polishing. Specially, it is easy to analyse a sample of SEM which includes an intermetallic compound (IMC) formed between the solder ball and the metal pad connected thereto. The following embodiment is described.

Figure 2A:
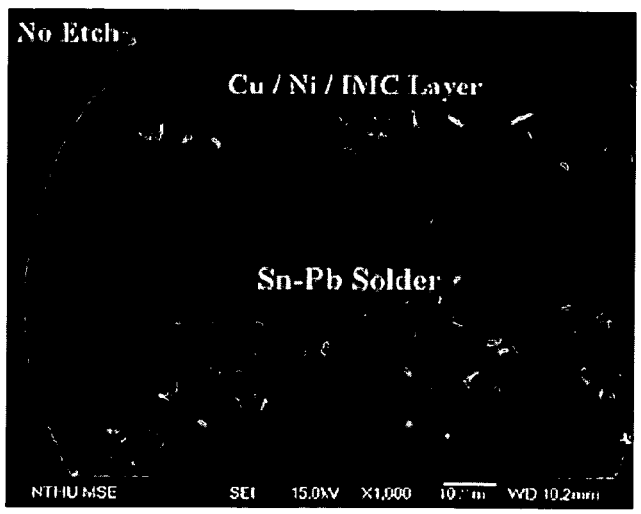
FIGS. 2A~2E are views of SEM image of a first sample of the present invention showing the SEM image that the energy of ion the beam is kept, the etching times are set in different time, and the SEM image is not etched yet.
Figure 2B:
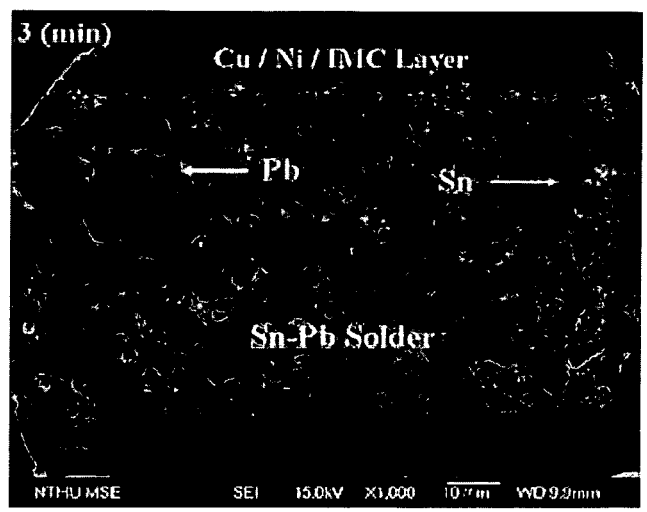
Figure 2C:
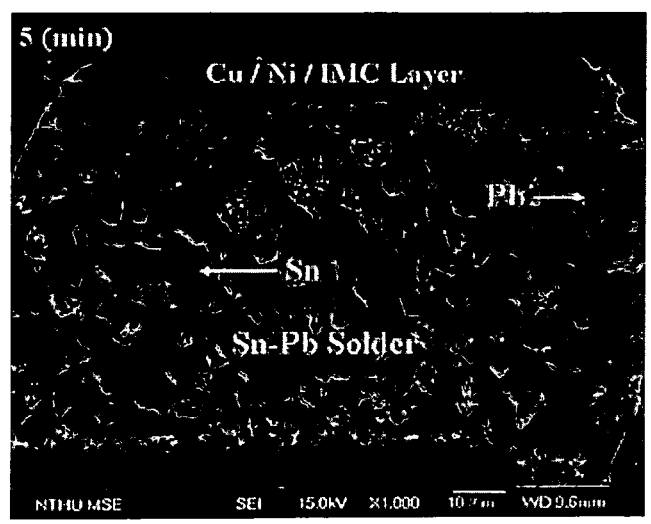
Figure 2D:
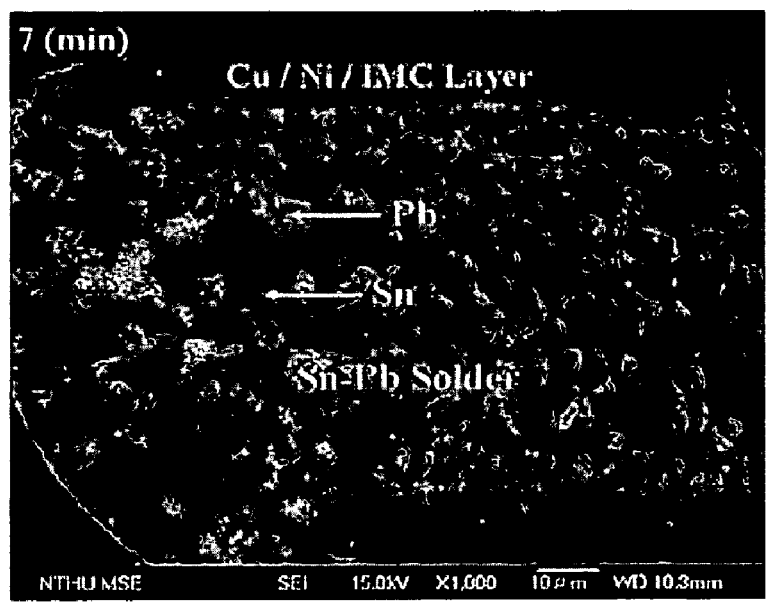
Figure 2E:
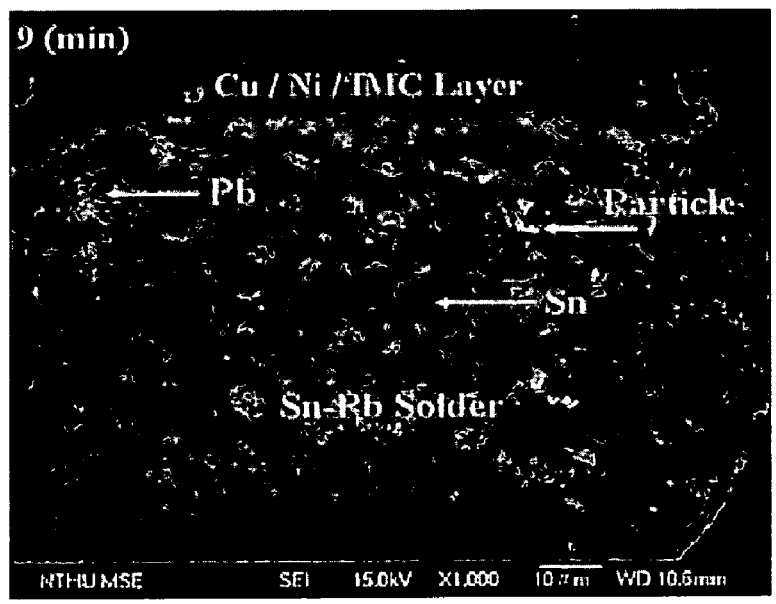
Figure 3A:
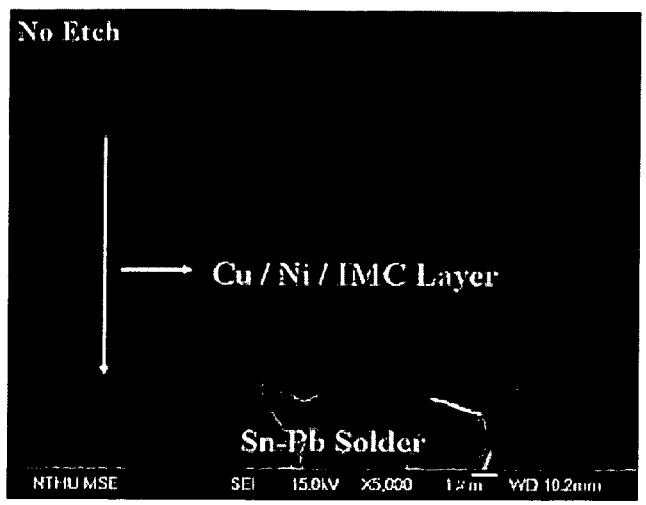
FIGS. 3A~3E are partially expanded view of SEM image respectively corresponding to FIGS. 2A~2E.
Figure 3B:
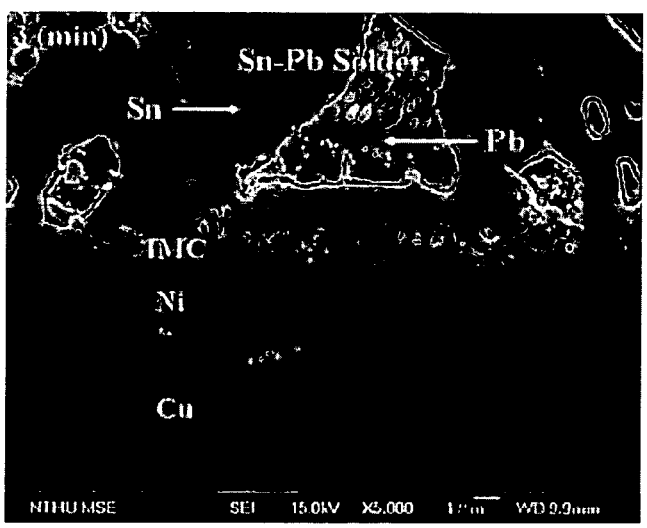
Figure 3C:
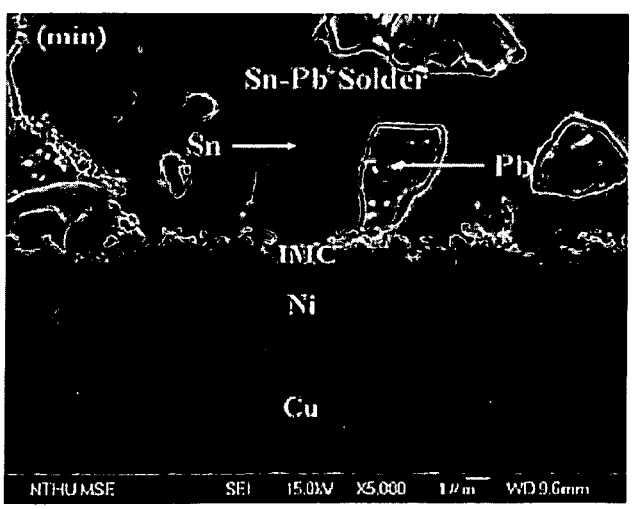
Figure 3D:
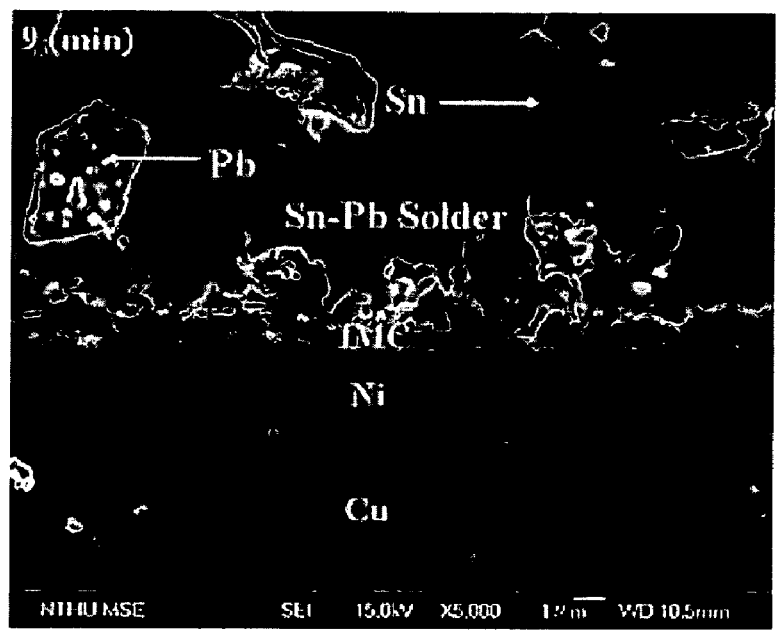
Figure 3E:
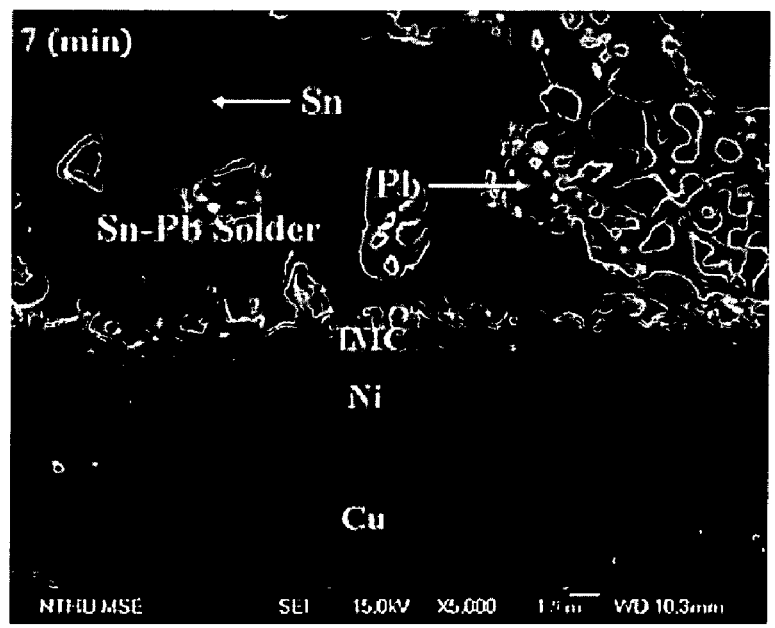

According to an embodiment of the first condition, the energy of the ion beam is kept to 2.5 keV. Argon (Ar) is a reactive gas and an ion resource, five sets of the etching times are respectively set in 3, 5, 7 and 9 minutes, the grinded polished thin flip chips are respectively etched by the ion beam, SEM images are respectively inspected through the scanning electron microscope, and the SEM images are shown in FIGS. 2A~2E. (FIG. 2A shows that grinded, polished thin flip chips that are not etched by an ion beam.) FIGS. 3A~3E are partial expanded views which are respectively corresponding to FIGS. 2A~2E.

Figure 5A:
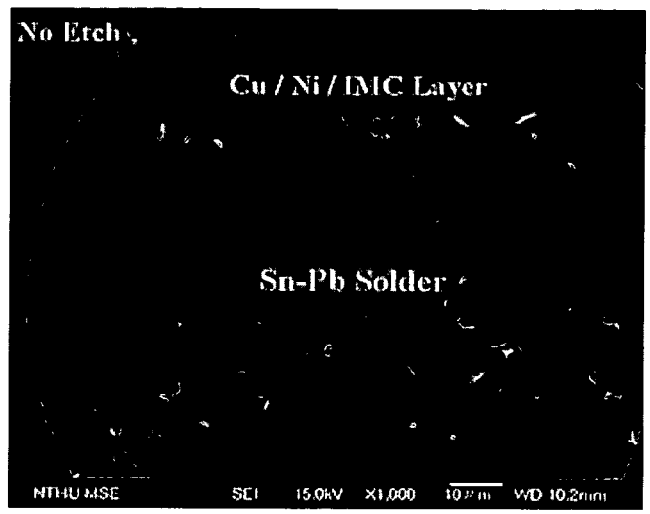
FIGS. 5A~5E are views of SEM image of a second sample of the present invention showing the SEM image that the energy of ion beam is different, the etching times are set to same time, and the SEM image is not etched yet.
Figure 5B:
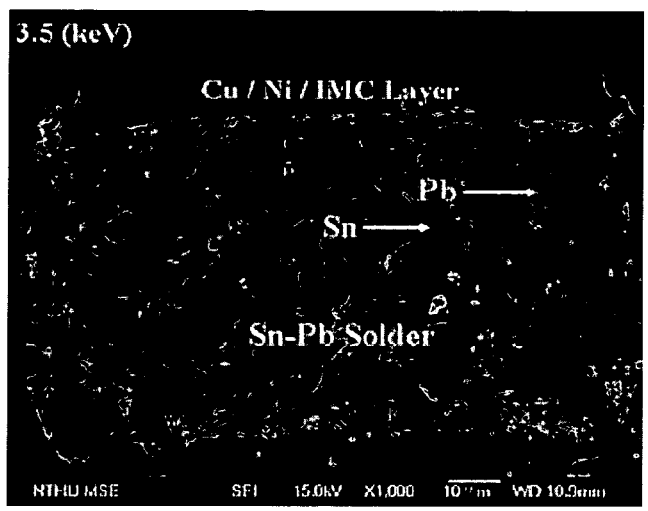
Figure 5C:
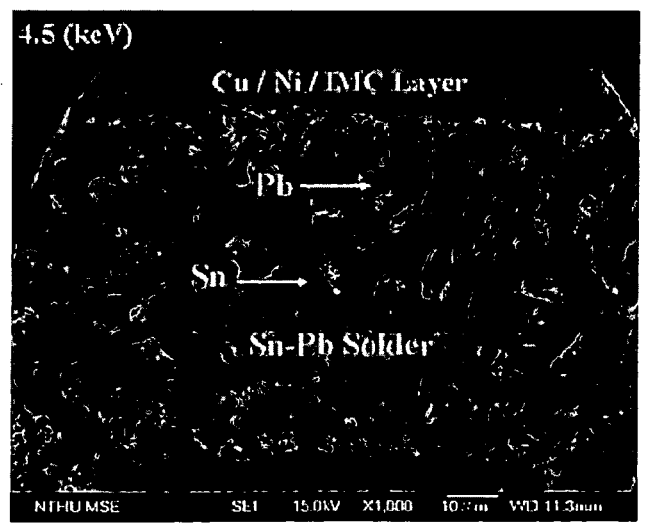
Figure 5D:
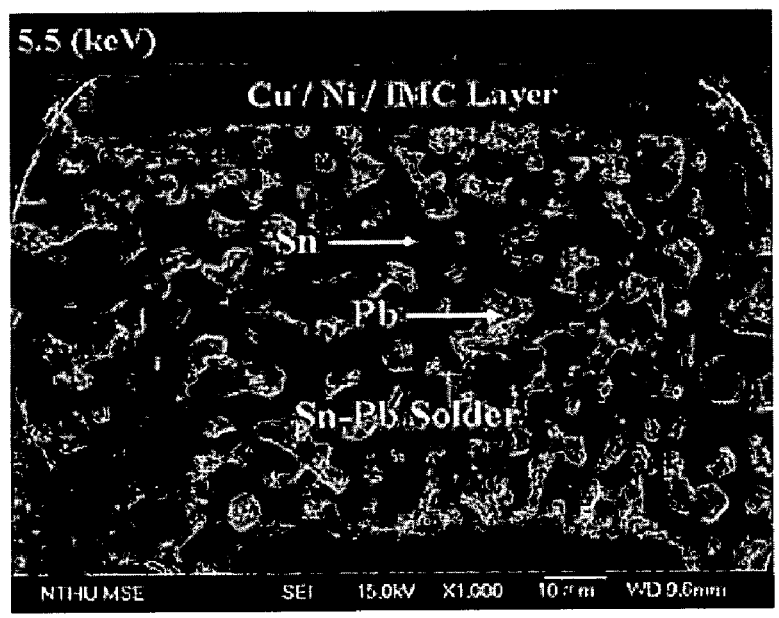
Figure 5E:
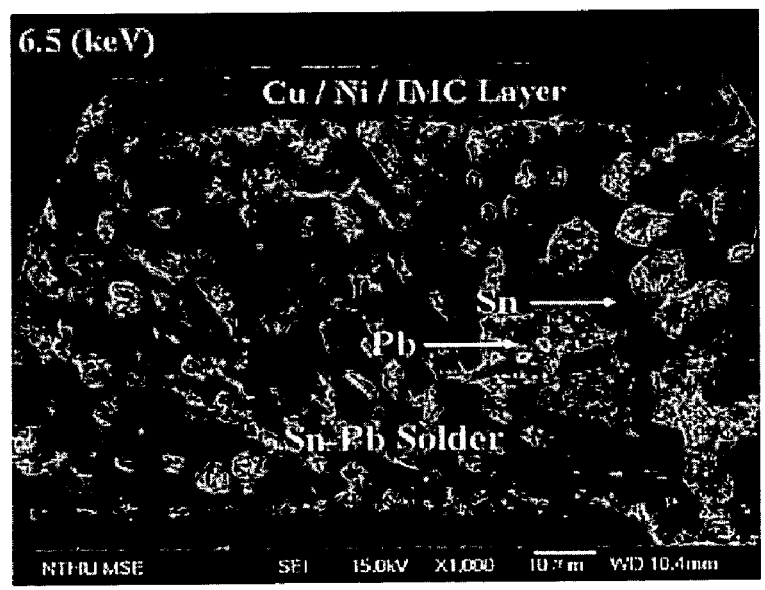
Figure 6A:
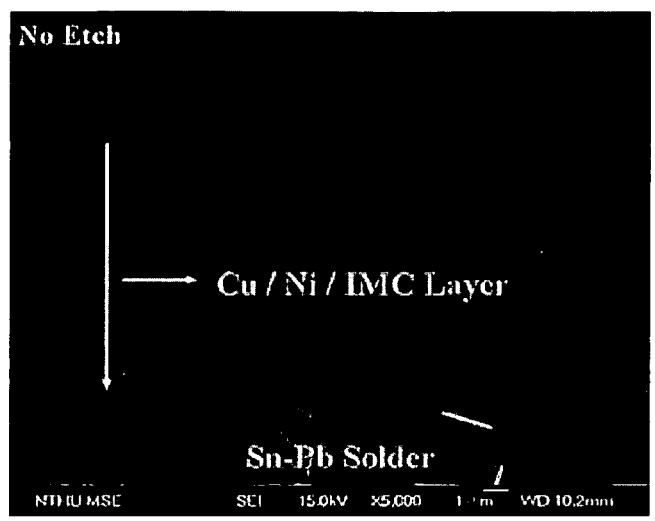
FIGS. 6A~6E are partially expanded views of SEM images respectively corresponding to FIGS. 5A~5E.
Figure 6B:
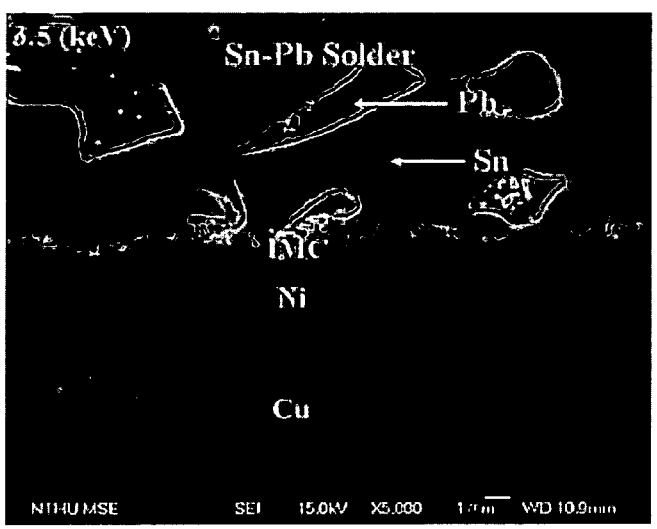
Figure 6C:
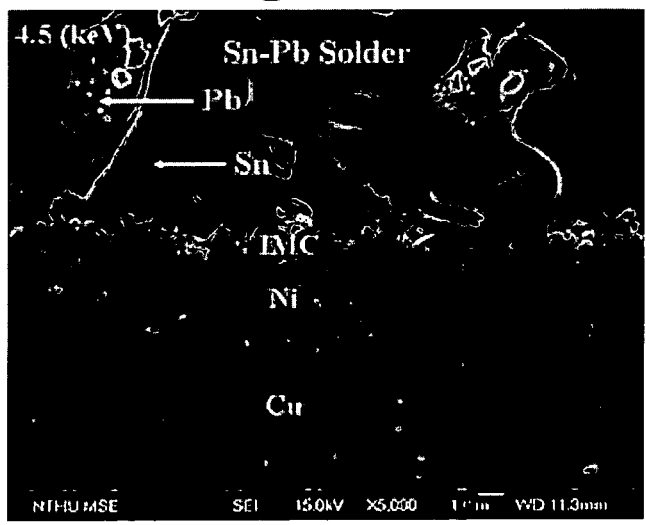
Figure 6D:
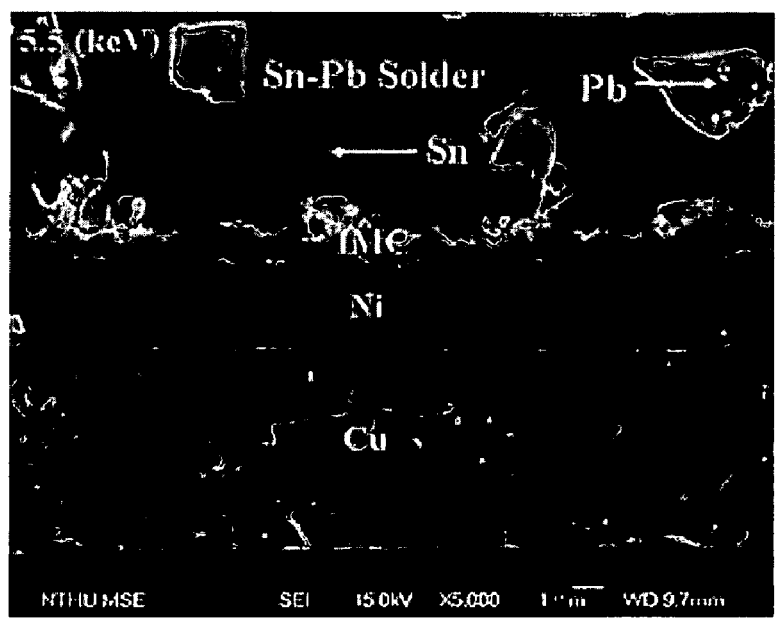
Figure 6E:
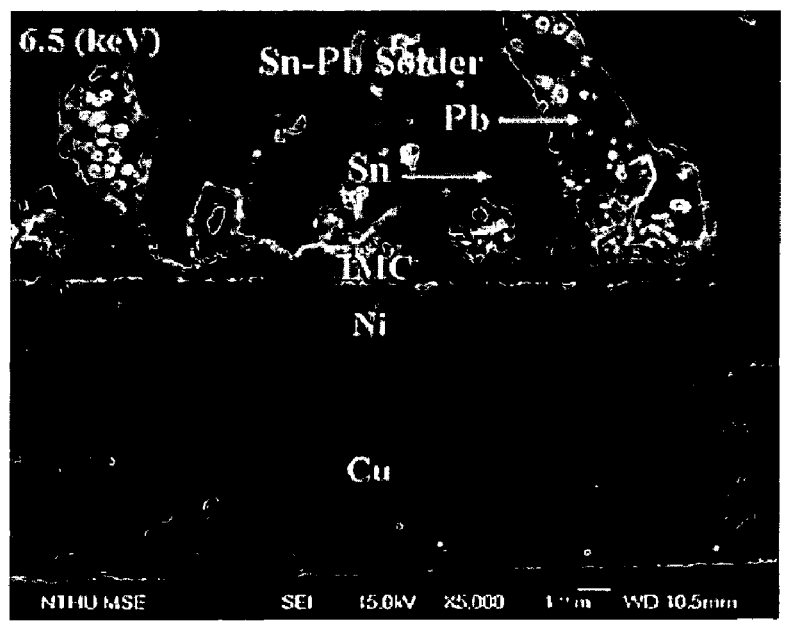

According to another embodiment of the second condition, the etching time is set to 3 minutes, argon (Ar) is a reactive gas and a resource of ions, the energy of the ion beam is respectively controlled to 3.5 keV, 4.5 keV, 5.5 keV and 6.5 keV, the grinded polished thin flip chips are respectively etched by the ion beam, SEM images are respectively inspected through the scanning electron microscope, and the SEM images are shown in FIGS. 5A~5E (FIG. 5A shows that the grinded polished thin flip chips are not etched by the ion beam). FIGS. 6A~6E are partial expanded views which correspond respectively to FIGS. 5A~5E.

After the flip chips have been etched by the ion beam according to the above-mentioned embodiments in two different conditions, it is easy to observe an interface between two phases of lead (Pb) and tin (Sn) in the solder ball and to view an intermetallic compound (IMC) which is formed into a wavy shape and disposed between the solder ball and metal pad connected thereto. Thus, it is helpful to analyze work of composition and micro-hardness. Furthermore, the thickness of the intermetallic compound can be also precisely measured; the thickness thereof is about 1 µm in the embodiment of the present invention. In addition, a pillar-shaped microstructure of nickel (Ni) can be also clearly observed.

Figure 4A:
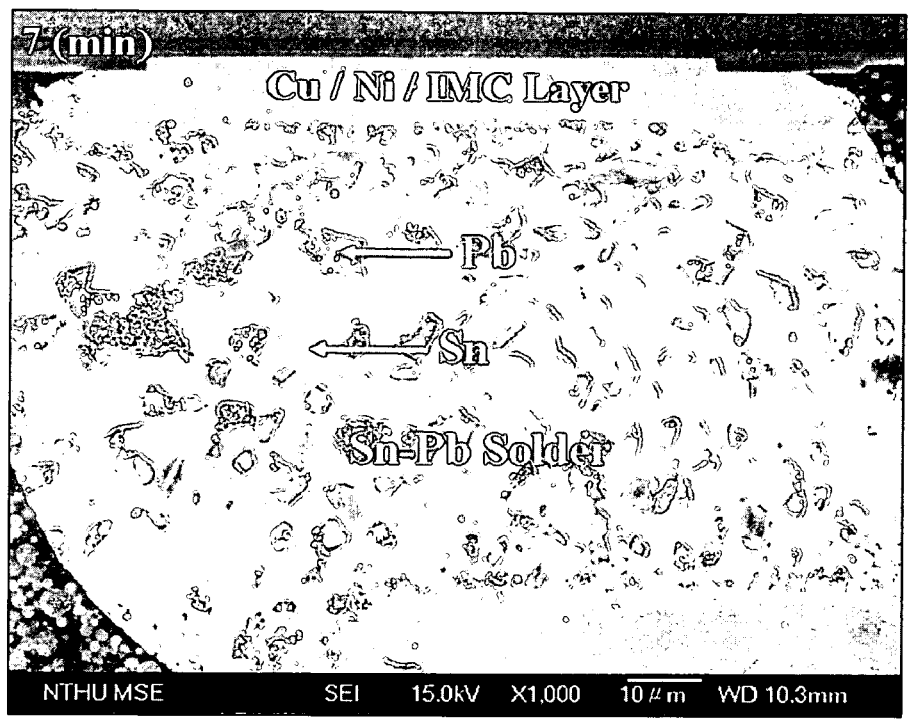
FIGS. 4A~4B are views of SEM image of the first sample according to a first preferred embodiment of the present invention.
Figure 4B:
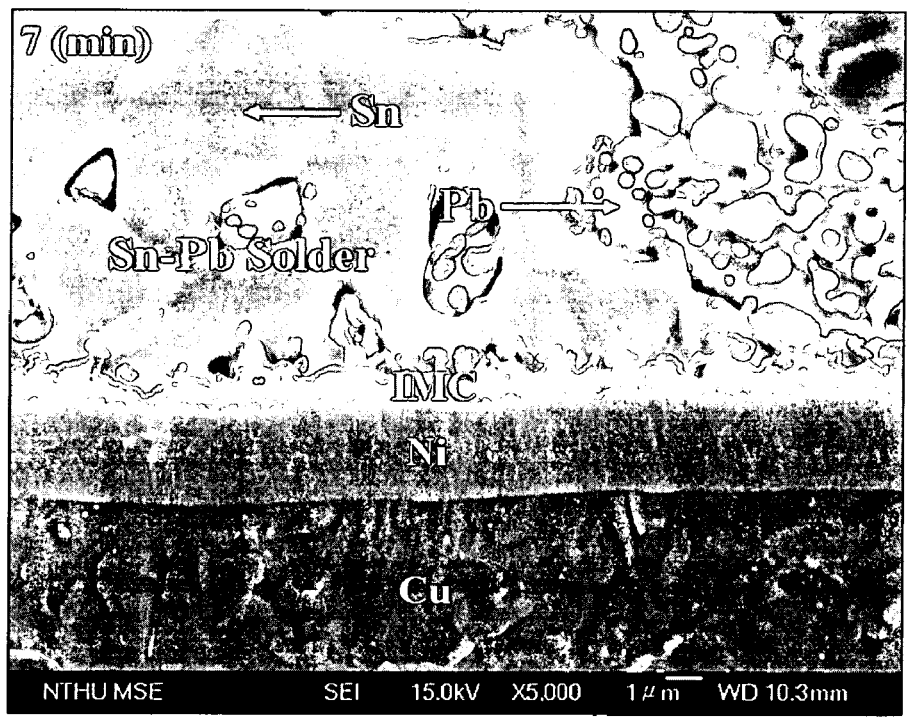
Figure 7A:
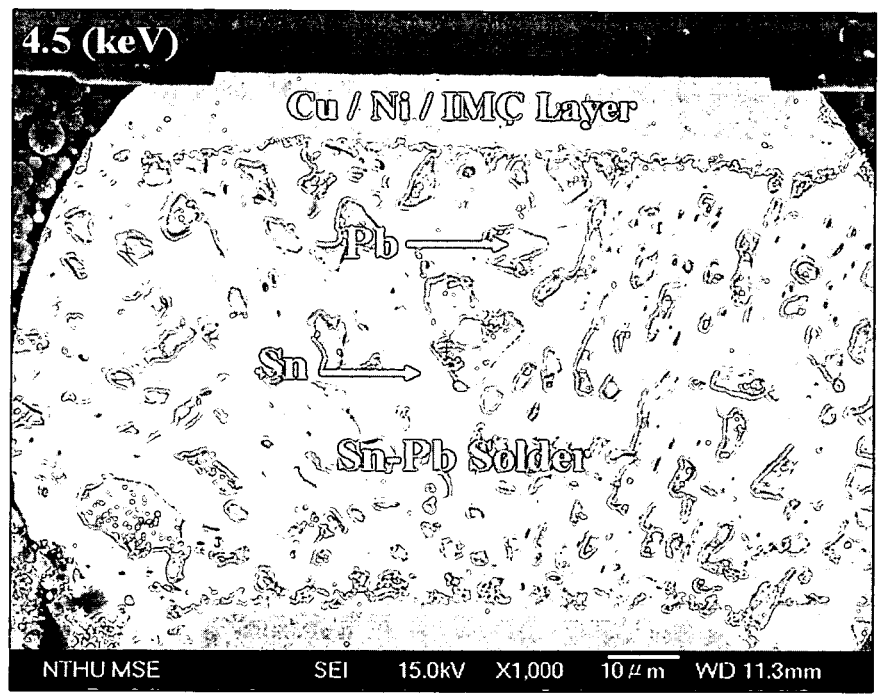
FIGS. 7A~7B are views of SEM image of the first sample according to a second preferred embodiment of the present invention.
Figure 7B:
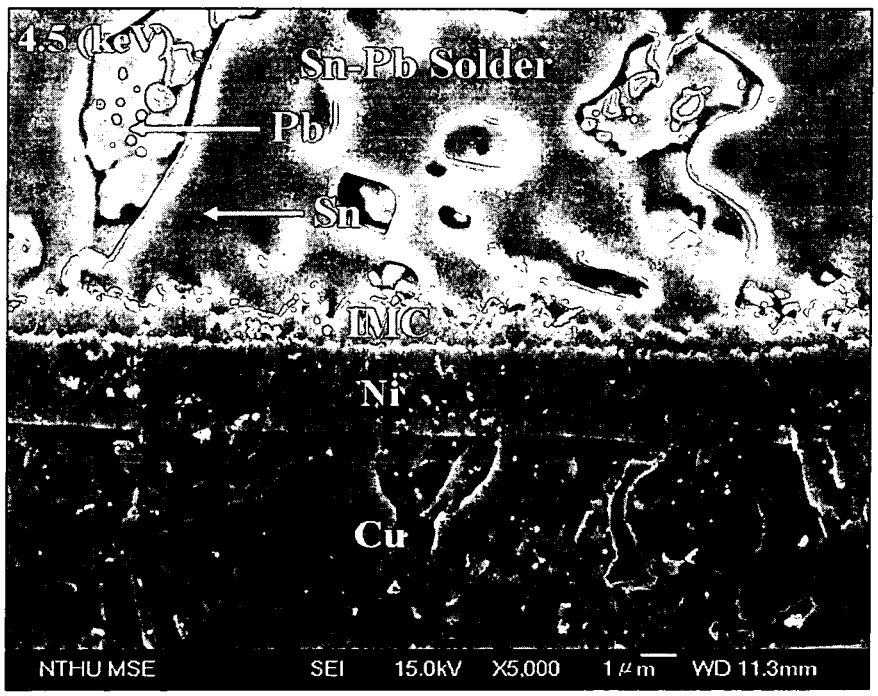
Figure 8A:
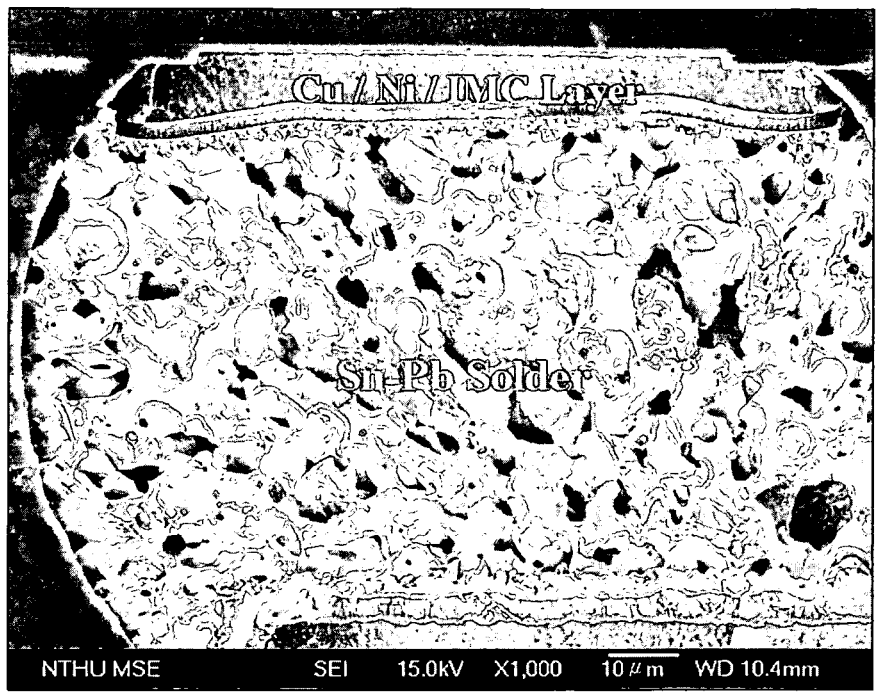
FIGS. 8A~8B are views of SEM image of the first sample according to conventional chemical etching methods showing the above-mentioned SEM image of the sample of the present invention.
Figure 8B:
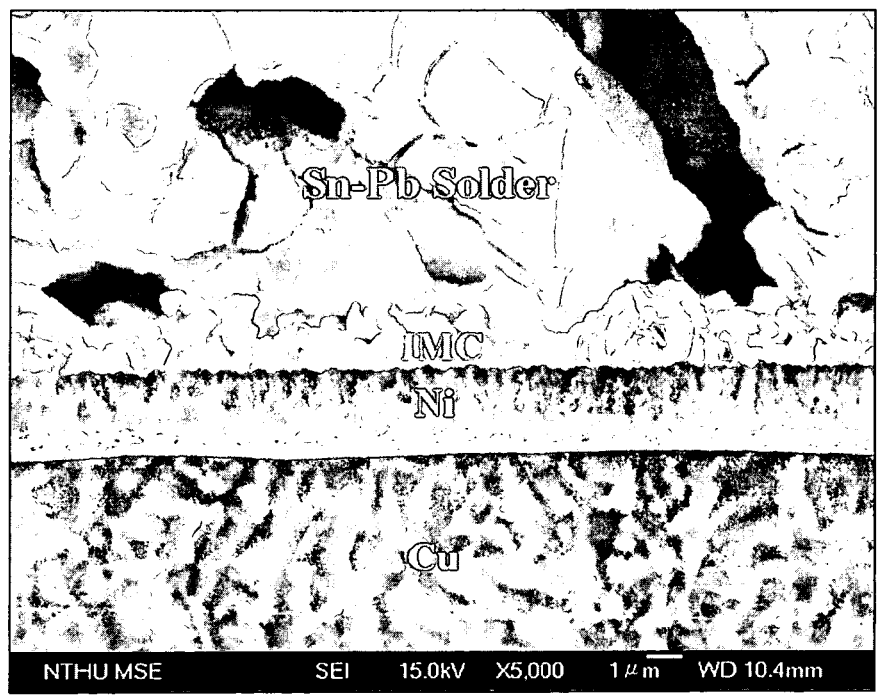

In conclusion, by getting the above-mentioned SEM images under different conditions, we can understand that the condition for getting the SEM image is described as follows:

(1). the energy of the ion beam kept to 2.5 keV and the etching time set to 7 minutes (as shown in FIGS. 4A~4B); and (2). the etching time of the ion beam set in 3 minutes and the energy kept to 4.5 keV (as shown in FIGS. 7A~7B).

As compared with the present invention, the prior art utilizes a chemical etching method (nitric acid:acetic acid:glycerin=1:1:4, the temperature is kept to 80 degrees Celsius, and the etching time is set to 3 minutes) to make an SEM image of a sample it is not easy to observe an interface between two phases of lead (Pb) and tin (Sn) in the solder ball and to observe an intermetallic compound.

The above-mentioned embodiment is a preferred embodiment only for disclosing the present invention, and condition parameters of an ion beam etching method including the energy of the ion beam, the etching time and type of the reactive gas of the ion resource to be used, all of which depend on the material of the solder bump and the connected metal pad, thereto in the connection of the flip chip.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for inspecting a connecting surface of a flip chip and for making and processing a sample according to a connecting structure of a flip chip (FC), the method comprising the following steps of:
    cutting the connecting structure of the flip chip, then forming a thin flip chip after grinding and polishing; and
    processing a surface of the thin flip chip so as to get the necessary sample of a scanning electron microscope (SEM) by an ion beam etching method.

2. The method according to claim 1, wherein the thin flip chip has thickness between 2.5 and 3 mm.

3. The method according to claim 1, wherein the ion beam etching method includes the energy of an ion beam kept at 2.5 keV and an etching time set to 7 minutes.

4. The method according to claim 1, wherein the ion beam etching method includes energy of an ion beam kept to 4.5 keV and etching time set to 3 minutes.

5. The method according to claim 1, wherein the ion beam etching method includes energy of an ion beam being between 4 keV and 6 keV and etching time set in 3 minutes.

* * * * *